United States Patent [19]
Wei et al.

[11] Patent Number: 5,923,075
[45] Date of Patent: *Jul. 13, 1999

[54] DEFINITION OF ANTI-FUSE CELL FOR PROGRAMMABLE GATE ARRAY APPLICATION

[75] Inventors: Che-Chia Wei, Plano, Tex.; Lap Chan, SF; Bob Lee, Sunnyvale, both of Calif.; Pom Suan Tan, Singapore, Singapore

[73] Assignee: Chartered Semiconductor Manufacturing Ltd., Singapore, Singapore

[ * ] Notice: This patent issued on a continued prosecution application filed under 37 CFR 1.53(d), and is subject to the twenty year patent term provisions of 35 U.S.C. 154(a)(2).

[21] Appl. No.: 08/630,706

[22] Filed: Apr. 8, 1996

[51] Int. Cl.$^6$ .................................................. H01L 29/00
[52] U.S. Cl. ......................... 257/528; 257/529; 257/530; 438/191; 438/193; 438/922
[58] Field of Search ................................... 257/530, 529, 257/528; 438/191, 193, 922

[56] References Cited

U.S. PATENT DOCUMENTS

| | | | |
|---|---|---|---|
| 4,796,074 | 1/1989 | Roesner | 357/51 |
| 4,943,538 | 7/1990 | Mohsen et al. | 257/530 |
| 5,070,384 | 12/1991 | McCollum et al. | 257/530 |
| 5,300,456 | 4/1994 | Tigelaar et al. | 257/530 |
| 5,322,812 | 6/1994 | Dixit et al. | 437/60 |
| 5,464,790 | 11/1995 | Hawley | 257/530 |
| 5,508,220 | 4/1996 | Eltoukhy et al. | 257/530 |
| 5,661,071 | 8/1997 | Chor | 257/530 |

*Primary Examiner*—William Mintel
*Attorney, Agent, or Firm*—George O. Saile; Rosemary L.S. Pike

[57] ABSTRACT

A method for fabricating an anti-fuse cell using an undoped polysilicon film as a mask in defining the anti-fuse window is described. A layer of silicon oxide is provided over the surface of a semiconductor substrate. A first undoped polysilicon layer is deposited overlying the silicon oxide layer. The first undoped polysilicon layer is covered with a photoresist layer patterned to form a mask. The first undoped polysilicon layer and a portion of the silicon oxide layer are etched away where they are not covered by the mask to form a cell opening. The mask and the remaining silicon oxide within the cell opening are removed. An insulating layer is deposited over the surface of the first undoped polysilicon layer and within the cell opening. A second polysilicon layer is deposited overlying the insulating layer and doped. The second polysilicon layer is patterned to form an anti-fuse cell. Gate electrodes and source and drain regions are formed completing the fabrication of the integrated circuit device.

30 Claims, 3 Drawing Sheets

DEFINITION OF ANTI-FUSE CELL FOR PROGRAMMABLE GATE ARRAY APPLICATION

BACKGROUND OF THE INVENTION (1) Field of the Invention

The invention relates to the fabrication of integrated circuit devices, and more particularly, to a method of defining an anti-fuse cell window in the fabrication of integrated circuits.

(2) Description of the Prior Art

In the fabrication of anti-fuse cells for programmable gate arrays, the current process uses a thin silicon nitride film as a mask in defining the anti-fuse cell window. Because of poor center to edge etching uniformity, silicon nitride residues are often left. FIG. 1 illustrates a partially completed integrated circuit device. On a semiconductor substrate, a layer of silicon nitride 15 has been deposited over a layer of silicon oxide 14. In the cell area A, a window 19 is etched, using the silicon nitride layer 15 as a mask. The window is then filled with an insulating layer 26 and polysilicon layer 28. However, in the active area B, because of the poor etching uniformity, silicon nitride residues 17 are left.

U.S. Pat. No. 4,796,074 to Roesner and U.S. Pat. No. 5,322,812 to Dixit et al show anti-fuse methods and resulting structures.

SUMMARY OF THE INVENTION

A principal object of the present invention is to provide an effective and very manufacturable method of fabricating an anti-fuse cell for programmable gate array.

A further object of the invention is to provide a method of fabricating an anti-fuse cell for programmable gate array without nitride residues.

Yet another object is to provide a method of fabricating an anti-fuse cell using an undoped polysilicon film as a mask in defining the anti-fuse window.

In accordance with the objects of this invention a method for fabricating an anti-fuse cell using an undoped polysilicon film as a mask in defining the anti-fuse window is achieved. A layer of silicon oxide is provided over the surface of a semiconductor substrate. A first undoped polysilicon layer is deposited overlying the silicon oxide layer. The first undoped polysilicon layer is covered with a photoresist layer patterned to form a mask. The first undoped polysilicon layer and a portion of the silicon oxide layer are etched away where they are not covered by the mask to form a cell opening. The mask and the remaining silicon oxide within the cell opening are removed. An insulating layer is deposited over the surface of the first undoped polysilicon layer and within the cell opening. A second polysilicon layer is deposited overlying the insulating layer and doped. The second polysilicon layer is patterned to form an anti-fuse cell. Gate electrodes and source and drain regions are formed completing the fabrication of the integrated circuit device.

Also in accordance with the objects of this invention, an anti-fuse cell device is described. A first undoped polysilicon layer overlies a silicon oxide layer on the surface of a semiconductor substrate. An insulating layer overlies the first undoped polysilicon layer and contacts the semiconductor substrate at the bottom of a cell opening through the first undoped polysilicon and the silicon oxide layers. A patterned second polysilicon layer overlies the insulating layer within the cell opening to form the anti-fuse cell.

BRIEF DESCRIPTION OF THE DRAWINGS

In the accompanying drawings forming a material part of this description, there is shown.

DESCRIPTION OF THE PREFERRED EMBODIMENTS

Figure 1:
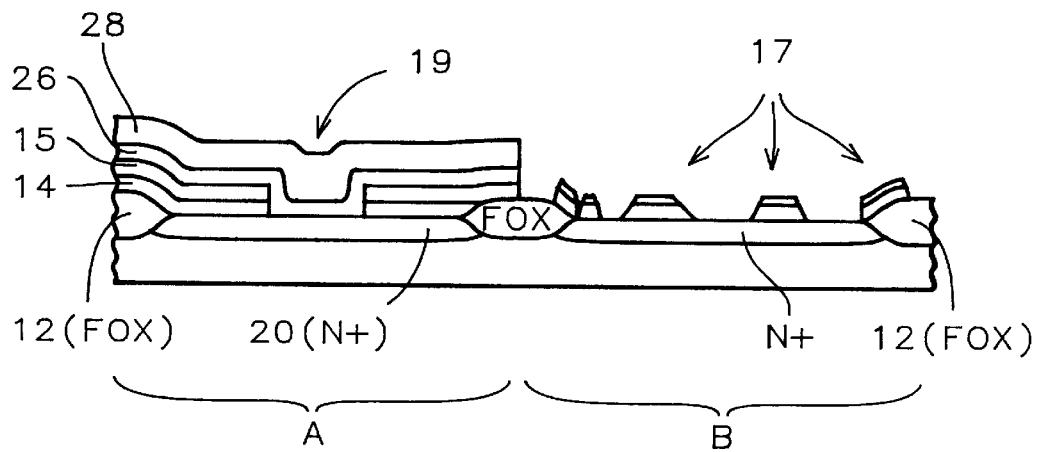
FIG. 1 schematically illustrates in cross-sectional representation an anti-fuse cell of the prior art.
Figure 2:
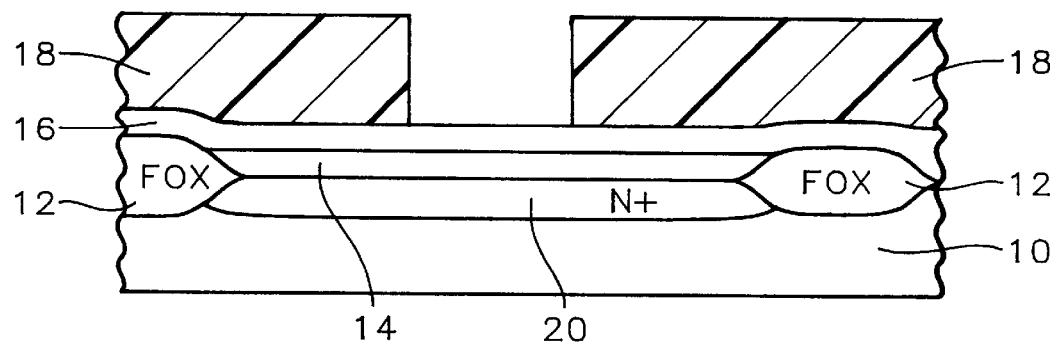
FIGS. 2 through 6 schematically illustrate in cross-sectional representation a preferred embodiment of the present invention.

Referring now more particularly to FIG. 2, there is shown an illustration of a portion of a partially completed integrated circuit. The semiconductor substrate 10 is preferably composed of silicon having a Si(100) crystallographic orientation. Field Oxide regions 12 are formed as are conventional in the art. The surface of the silicon substrate 10 is thermally oxidized to form the desired pad oxide 14 thickness. The preferred thickness is between about 500 to 1500 Angstroms.

N+ active area 20 is formed by ion implantation and diffusion drive-in. For example, phosphorus ions are implanted with a dosage of between about 2 E 13 to 1 E 14 atoms/cm$^2$ at an energy of between about 40 to 60 KeV. Alternatively, arsenic ions are implanted with a dosage of between about 1 E 15 to 5 E 15 atoms/cm$^2$ at an energy of between about 40 to 60 KeV.

In the conventional process of the prior art, a thin silicon nitride film is used as a mask for the cell window definition. In the process of the present invention, a layer of undoped polysilicon or amorphous silicon 16 is deposited by low pressure chemical vapor deposition (LPCVD) to a thickness of between about 400 to 1500 Angstroms.

A layer of photoresist is coated over the polysilicon layer 16 and patterned as is conventional in the art to form a photoresist mask 18, as illustrated in FIG. 2.

Figure 3:
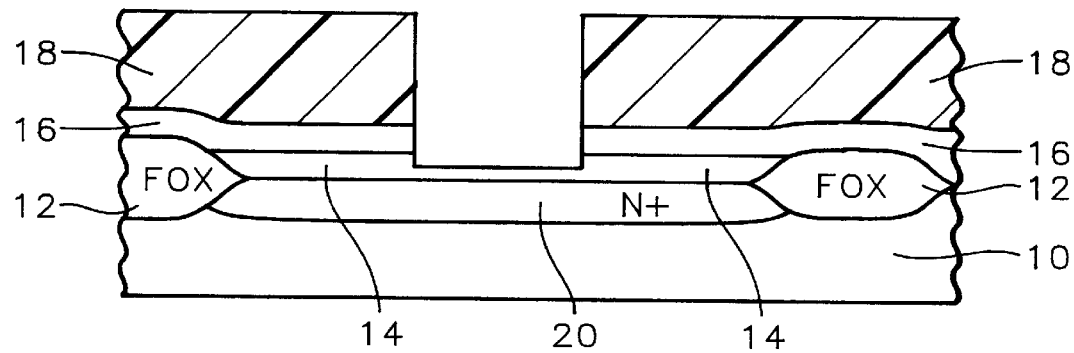

Referring now to FIG. 3, the polysilicon or amorphous silicon layer 16 is etched selectively with respect to the pad oxide until between about 200 to 600 Angstroms of the pad oxide 14 remains within the cell openings. A one step dry etch is all that is necessary to etch both the polysilicon and the pad oxide. Using a nitride film instead of the undoped polysilicon or amorphous silicon requires a two step wet and dry etch. The one step etch saves cycle time. Also, the elimination of the wet etch step eliminates an undercutting of the pad oxide during the cell opening wet etch.

LPCVD silicon nitride film deposition is much dirtier, in terms of particle count, than LPCVD polysilicon or amorphous silicon deposition. Therefore, etching the undoped polysilicon or amorphous film is easier and cleaner than etching a nitride film. Also, polysilicon and amorphous silicon have better sidewall control and there better process control for oxide remaining in the present invention.

Figure 4:
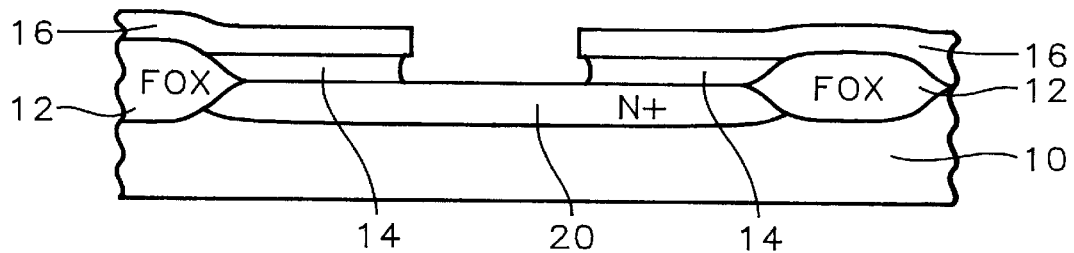

The photoresist mask 18 is stripped and the remaining pad oxide within the openings is wet etched away using a buffered oxide etch (BOE), as shown in FIG. 4. The BOE etch is performed with an etch rate of between about 300 to 360 Angstroms/minute for between about 4 to 6 minutes. The slight undercutting of the silicon oxide layer results from the BOE etch.

Figure 5:
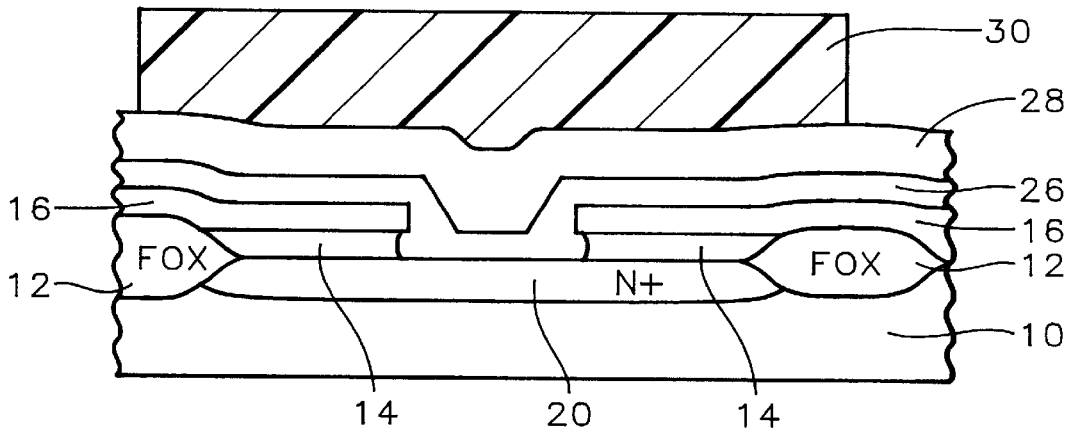

Referring now to FIG. 5, an insulating layer 26 is deposited overlying the undoped polysilicon layer 16 and within the cell openings. This insulating layer may be ONO (silicon oxide, silicon nitride, silicon oxide) or NO (silicon nitride, silicon oxide) with a total thickness of between about 40 to 120 Angstroms. Next a layer 28 of polysilicon is deposited over the insulating layer 26 to a thickness of between about 2500 to 4000 Angstroms. The polysilicon layer 28 is doped by POCl$_3$ and arsenic or phosphorus to a dopant concentration of between about 1 E 19 to 1 E 21 atoms/cm$^3$.

Figure 6:
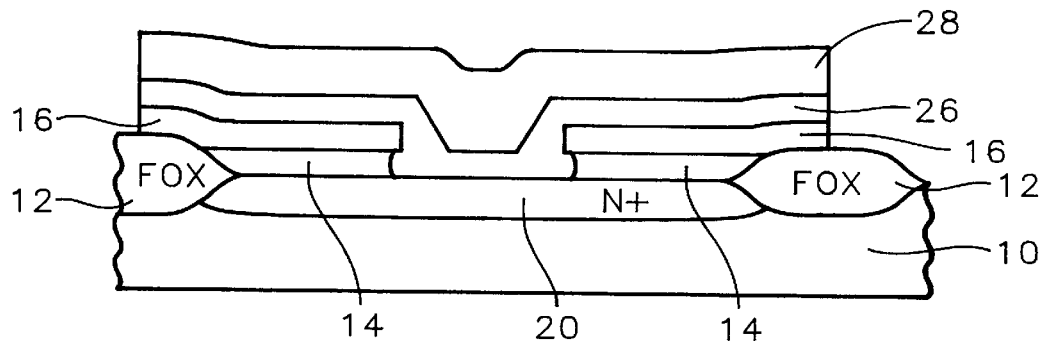

A layer of photoresist is coated over the doped polysilicon layer 28 and patterned to form a mask 30. Referring now to FIG. 6, the polysilicon layer 28, insulating layer 26, undoped polysilicon or amorphous silicon layer 16, and a portion of the silicon oxide 14 and/or field oxide region 12 are etched away where they are not covered by the mask 30 and the photoresist is stripped.

Figure 7:
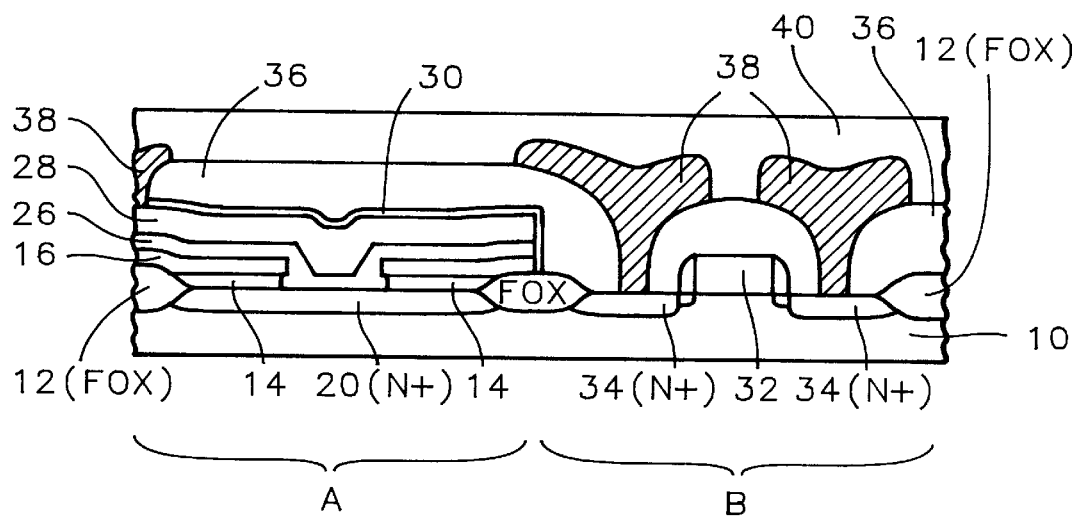
FIG. 7 schematically illustrate in cross-sectional representation a completed anti-fuse cell of the present invention.

This completes the formation of the anti-fuse cell. The integrated circuit device is completed as is conventional in the art. For example, as illustrated in FIG. 7, a spacer oxide 30 is deposited conformally over the polysilicon 28. In the active portion of the integrated circuit device B, gate electrode 32 and source and drain regions 34 are formed. An insulting layer 36 is blanket deposited over all. Openings are etched through the insulting layer 36 where electrical contacts are to be made, for example to source and drain regions 34 and to the anti-fuse cell 28. A conducting layer 38 is deposited and patterned to complete the electrical connections, followed by the deposition of passivation layer 40.

The process of the invention provides an effective method of fabricating an anti-fuse cell without nitride residues. The process of the invention is a simplified process. Etching a stack containing undoped polysilicon or amorphous silicon rather than silicon nitride is easier, cleaner, and more controllable.

In accordance with another aspect of the present invention, an anti-fuse cell for a programmable gate array is described with reference to FIG. 7. In the cell area A, a first layer 16 of undoped polysilicon or amorphous silicon overlies a silicon oxide layer 14 on the surface of a semiconductor substrate 10. An insulating layer 26 overlies the first undoped polysilicon layer and contacts the semiconductor substrate at the bottom of the cell opening through the first undoped polysilicon or amorphous silicon and the silicon oxide layers. A patterned second polysilicon layer 28 overlies the insulating layer within the cell opening to form the anti-fuse cell. In the active area, gate electrode 32 and source and drain regions 34 are covered by insulating layer 36 which also covers the anti-fuse cell 28. Patterned conducting layer 38 electrically connects the anti-fuse cell and the source and drain regions.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing a layer of silicon oxide over the surface of a semiconductor substrate wherein said semiconductor substrate has a cell area and an active area;

in said cell area:

depositing a first undoped polysilicon layer as an etching mask overlying said silicon oxide layer;

covering said first undoped polysilicon layer with a photoresist layer and patterning said photoresist layer to form a photomask;

etching away said first undoped polysilicon layer and a portion of said silicon oxide where it is not covered by said photomask using a one-step dry etch to form a cell opening;

removing said photomask;

thereafter removing remaining said silicon oxide within said cell opening using said first undoped polysilicon layer as said etching mask whereby said first undoped polysilicon layer is slightly undercut;

depositing an insulating layer over the surface of said first undoped polysilicon layer and within said cell opening;

depositing a second polysilicon layer overlying said insulating layer and doping said second polysilicon layer; and thereafter patterning said second polysilicon layer, said insulating layer, said first undoped polysilicon layer, and said silicon oxide layer to form an anti-fuse cell; and in said active area forming gate electrodes and source and drain regions completing the fabrication of said integrated circuit device.

2. The method according to claim 1 wherein said silicon oxide layer has a thickness of between about 500 to 1500 Angstroms.

3. The method according to claim 1 wherein said first undoped poly silicon layer is deposited by low pressure chemical vapor deposition to a thickness of between about 400 to 1500 Angstroms.

4. The method according to claim 1 wherein said etching away of said first undoped poly silicon layer and a portion of said silicon oxide layer comprises a dry etch using one or more of the group containing $C_2F_6$, $SF_6$, $Cl_2$, and HBr.

5. The method according to claim 1 wherein said remaining portion of said silicon oxide layer has a thickness of between about 200 to 600 Angstroms.

6. The method according to claim 1 wherein said remaining silicon oxide within said cell opening is removed with a buffered oxide etch (BOE) with an etch rate of between about 300 to 360 Angstroms/minute for between about 4 to 6 minutes.

7. The method according to claim 1 wherein said insulating layer comprises silicon oxide, silicon nitride, and silicon oxide (ONO) with a total thickness of between about 40 to 120 Angstroms.

8. The method according to claim 1 wherein said insulating layer comprises silicon oxide and silicon nitride (NO) with a total thickness of between about 40 to 120 Angstroms.

9. The method according to claim 1 wherein said second polysilicon layer is deposited by LPCVD to a thickness of between about 2500 to 4000 Angstroms.

10. The method according to claim 1 wherein said second polysilicon layer is doped with a POCl$_3$ plus arsenic implant to a dopant concentration of between about 1 E 19 to 1 E 21 atoms/cm$^3$.

11. The method according to claim 1 wherein said second polysilicon layer is doped with a POCl$_3$ plus phosphorus implant to a dopant concentration of between about 1 E 19 to 1 E 21 atoms/cm$^3$.

12. A method of forming an anti-fuse cell in the fabrication of an integrated circuit device comprising:

providing a layer of silicon oxide over the surface of a semiconductor substrate;

depositing a first undoped silicon layer chosen from the group containing polysilicon and amorphous silicon as a mask overlying said silicon oxide layer;

covering said first undoped silicon layer with a photoresist layer and patterning said photoresist layer to form a photomask;

etching away said first undoped silicon layer and a portion of said silicon oxide where it is not covered by said photomask using a one-step dry etch to form a cell opening;

removing said photomask;

thereafter removing remaining said silicon oxide within said cell opening using said first undoped silicon layer as said mask whereby said first undoped silicon layer is slightly undercut;

depositing an insulating layer over the surface of said first undoped silicon layer and within said cell opening;

depositing a second polysilicon layer overlying said insulating layer and doping said second polysilicon layer; and patterning said second polysilicon layer, said insulating layer, said first undoped silicon layer, and said silicon oxide layer to complete the formation of an anti-fuse cell in the fabrication of said integrated circuit device.

13. The method according to claim 12 wherein said silicon oxide layer has a thickness of between about 500 to 1500 Angstroms.

14. The method according to claim 12 wherein said first undoped silicon layer is deposited by low pressure chemical vapor deposition to a thickness of between about 400 to 1500 Angstroms.

15. The method according to claim 12 wherein said etching away of said first undoped silicon layer and a portion of said silicon oxide layer comprises a dry etch using one or more of the group containing $C_2F_6$, $SF_6$, $Cl_2$, and HBr.

16. The method according to claim 12 wherein said remaining portion of said silicon oxide layer has a thickness of between about 200 to 600 Angstroms.

17. The method according to claim 12 wherein said remaining silicon oxide within said cell opening is removed with a buffered oxide etch (BOE) with an etch rate of between about 300 to 360 Angstroms/minute for between about 4 to 6 minutes.

18. The method according to claim 12 wherein said insulating layer comprises silicon oxide, silicon nitride, and silicon oxide (ONO) with a total thickness of between about 40 to 120 Angstroms.

19. The method according to claim 12 wherein said insulating layer comprises silicon oxide and silicon nitride (NO) with a total thickness of between about 40 to 120 Angstroms.

20. The method according to claim 12 wherein said second polysilicon layer is deposited by LPCVD to a thickness of between about 2500 to 4000 Angstroms.

21. The method according to claim 12 wherein said second polysilicon layer is doped with a $POCl_3$ plus arsenic implant to a dopant concentration of between about 1 E 19 to 1 E 21 atoms/$cm^3$.

22. The method according to claim 12 wherein said second polysilicon layer is doped with a $POCl_3$ plus phosphorus implant to a dopant concentration of between about 1 E 19 to 1 E 21 atoms/$cm^3$.

23. A method of fabricating an integrated circuit device comprising:

providing a layer of silicon oxide over the surface of a semiconductor substrate wherein said semiconductor substrate has a cell area and an active area and wherein field oxide regions separate said cell area from said active area;

in said cell area:

depositing an amorphous silicon layer as an etching mask overlying said silicon oxide layer;

covering said amorphous silicon layer with a photoresist layer and patterning said photoresist layer to form a photomask;

etching away said amorphous silicon layer and a portion of said silicon oxide where it is not covered by said photomask to form a cell opening wherein said etching away comprises a one-step dry etching;

removing said photomask and remaining silicon oxide within said cell opening using said amorphous silicon layer as said etching mask and using a buffered oxide etch wherein said removing said remaining silicon oxide slightly undercuts said amorphous silicon layer;

depositing an insulating layer over the surface of said amorphous silicon layer and within said cell opening;

depositing a polysilicon layer overlying said insulating layer and doping said polysilicon layer; and thereafter patterning said polysilicon layer, said insulating layer, said amorphous silicon layer, and said silicon oxide layer to form an anti-fuse cell; and in said active area forming gate electrodes and source and drain regions completing the fabrication of said integrated circuit device.

24. The method according to claim 23 wherein said silicon oxide layer has a thickness of between about 500 to 1500 Angstroms.

25. The method according to claim 23 wherein said amorphous silicon layer is deposited by low pressure chemical vapor deposition to a thickness of between about 400 to 1500 Angstroms.

26. The method according to claim 23 wherein said one-step dry etching uses one or more of the group containing $C_2F_6$, $SF_6$, 5 $Cl_2$, and HBr.

27. The method according to claim 23 wherein said remaining silicon oxide within said cell opening is removed with a buffered oxide etch (BOE) with an etch rate of between about 360 to 360 Angstroms/minute for between about 4 to 6 minutes.

28. The method according to claim 23 wherein said insulating layer comprises silicon oxide, silicon nitride, and silicon oxide (ONO) with a total thickness of between about 40 to 120 Angstroms.

29. The method according to claim 23 wherein said insulating layer comprises silicon oxide and silicon nitride (NO) with a total thickness of between about 40 to 120 Angstroms.

30. The method according to claim 23 wherein said polysilicon layer is deposited by LPCVD to a thickness of between about 2500 to 4000 Angstroms.

* * * * *